United States Patent
Li et al.

(10) Patent No.: US 11,164,628 B2
(45) Date of Patent: Nov. 2, 2021

(54) COMPENSATING PCM DRIFT FOR NEUROMORPHIC APPLICATIONS

(71) Applicant: International Business Machines Corporation, Armonk, NY (US)

(72) Inventors: Ning Li, White Plains, NY (US); Wanki Kim, Chappaqua, NY (US); Stephen W. Bedell, Wappingers Falls, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/797,626

(22) Filed: Feb. 21, 2020

(65) Prior Publication Data

US 2021/0264978 A1    Aug. 26, 2021

(51) Int. Cl.
*G11C 11/00* (2006.01)
*G11C 13/00* (2006.01)
*G06N 3/063* (2006.01)

(52) U.S. Cl.
CPC ....... *G11C 13/0069* (2013.01); *G06N 3/0635* (2013.01); *G11C 13/0004* (2013.01); *G11C 2013/0092* (2013.01)

(58) Field of Classification Search
CPC ................................................. G11C 13/0004
USPC ....................................................... 365/163
See application file for complete search history.

(56) References Cited

U.S. PATENT DOCUMENTS

| | | | |
|---|---|---|---|
| 6,914,801 B2 | 7/2005 | Kostylev et al. |
| 7,778,066 B2 | 8/2010 | Horii et al. |
| 7,830,705 B2 | 11/2010 | Jeong |
| 7,978,508 B2 | 7/2011 | Czubatyj |
| 9,472,274 B1 | 10/2016 | Lung |
| 9,558,823 B1 | 1/2017 | Khwa et al. |
| 2008/0266942 A1 | 10/2008 | Jeong et al. |

(Continued)

FOREIGN PATENT DOCUMENTS

EP    2249351 A1    11/2010

OTHER PUBLICATIONS

Suri et al. "Impact of PCM Resistance-Drift in Neuromorphic Systems and Drift-Mitigation Strategy" 2013 IEEE/ACM International Symposium on Nanoscale Architectures (NANOARCH) Jul. 2013, New York, United States. IEEE, 2013 IEEE/ACM International Symposium on Nanoscale Architectures (NANOARCH).

(Continued)

*Primary Examiner* — Hoai V Ho
(74) *Attorney, Agent, or Firm* — Harrington & Smith

(57) ABSTRACT

An apparatus includes an analog phase change memory array, including an array of cells addressable and accessible through first lines and second lines. The apparatus includes device(s) coupled to one or more of the first lines. The device(s) is/are able to be coupled to or decoupled from the one or more first lines to compensate for phase change memory resistance drift in resistance of at least one of the cells in the one or more first lines. The apparatus may also include control circuitry configured to send, using the first lines and second lines, a same set pulse through the device(s) to multiple individual phase change memory resistors in the phase change memory array sequentially once every period.

20 Claims, 5 Drawing Sheets

(56) References Cited

U.S. PATENT DOCUMENTS

| | | | |
|---|---|---|---|
| 2009/0016100 A1* | 1/2009 | Jeong | G11C 13/0004 |
| | | | 365/163 |
| 2011/0122684 A1 | 5/2011 | Sheu et al. | |
| 2011/0188304 A1* | 8/2011 | Chang-Wook | G11C 11/56 |
| | | | 365/163 |
| 2019/0391759 A1 | 12/2019 | Kang et al. | |

OTHER PUBLICATIONS

Wabe W. Koelmans et al. "Projected Phase-Change Memory Devices" Nature Communications. Published Sep. 3, 2015. DOI:10.1038/ncomms9181.

* cited by examiner

COMPENSATING PCM DRIFT FOR NEUROMORPHIC APPLICATIONS

BACKGROUND

This invention relates generally to neuromorphic computing and, more specifically, relates to phase change memory (PCM) in neuromorphic computing.

Phase-change memory (PCM) is memory that can store information while power is off. This memory is referred to as such because of its ability to switch from a disorderly (or amorphous) state to an orderly (or crystalline) one very quickly. PCM scores well in terms of most of the desirable attributes of a universal memory technology. In particular, it exhibits very good endurance on the order of 1 million cycles or more, moderate retention, and superb scalability to sub-20-nm nodes and beyond. In addition, it is amenable to multilevel-cell storage, thanks to the large resistivity contrast between its SET and RESET states. However, a number of technological challenges need to be addressed for PCM to become universal memory. A significant challenge of PCM technology is a phenomenon known as resistance drift: The resistance of a cell is observed to drift upwards in time, with the amorphous state drifting more than its crystalline counterpart. Drift seriously affects the reliability of multilevel-cell (MLC) storage in PCM because of the reduced sensing margin between adjacent tightly-packed resistance levels.

In more detail, neuromorphic computing requires multiple (about 1,000) resistance levels. The resistance difference between states is much smaller than in storage class memory, where only two resistance states are required.

Further, the neural network training time is typically long, e.g., on the orders of hours, days, or even weeks. Meanwhile, the drift of PCM in one hour could mix two adjacent resistance states. Resistance drift is fundamental to disordered materials, such as amorphous materials or materials with a mix of amorphous and poly-crystalline regions.

The resistance drift does not need to be zero, but the drift coefficient needs to be reduced to, e.g., <0.005 for neuromorphic applications. Conventional techniques such as projected cell have been proposed to reduce PCM resistance drift, but the results cannot meet the target drift coefficient of less than 0.005.

SUMMARY

This section is meant to be exemplary and not meant to be limiting.

An exemplary embodiment is an apparatus. The apparatus includes an analog phase change memory array. The phase change memory array includes an array of cells addressable and accessible through first lines and second lines. The apparatus includes at least one device coupled to one or more of the first lines, the at least one device able to be coupled to or decoupled from the one or more first lines to compensate for phase change memory resistance drift in resistance of at least one of the cells in the one or more first lines.

Another exemplary embodiment is an apparatus. The apparatus includes an analog phase change memory array, the phase change memory array including an array of cells addressable and accessible through first lines and second lines. The apparatus also includes at least one device coupled to one or more of the first lines. The at least one device is able to be coupled to or decoupled from the one or more first lines to compensate for phase change memory resistance drift in resistance of at least one of the cells in the one or more first lines. The apparatus also includes control circuitry configured to send, using the first lines and second lines, a same set pulse through the at least one device to a plurality of individual phase change memory resistors in the phase change memory array sequentially once every period.

DETAILED DESCRIPTION

Figure 1:
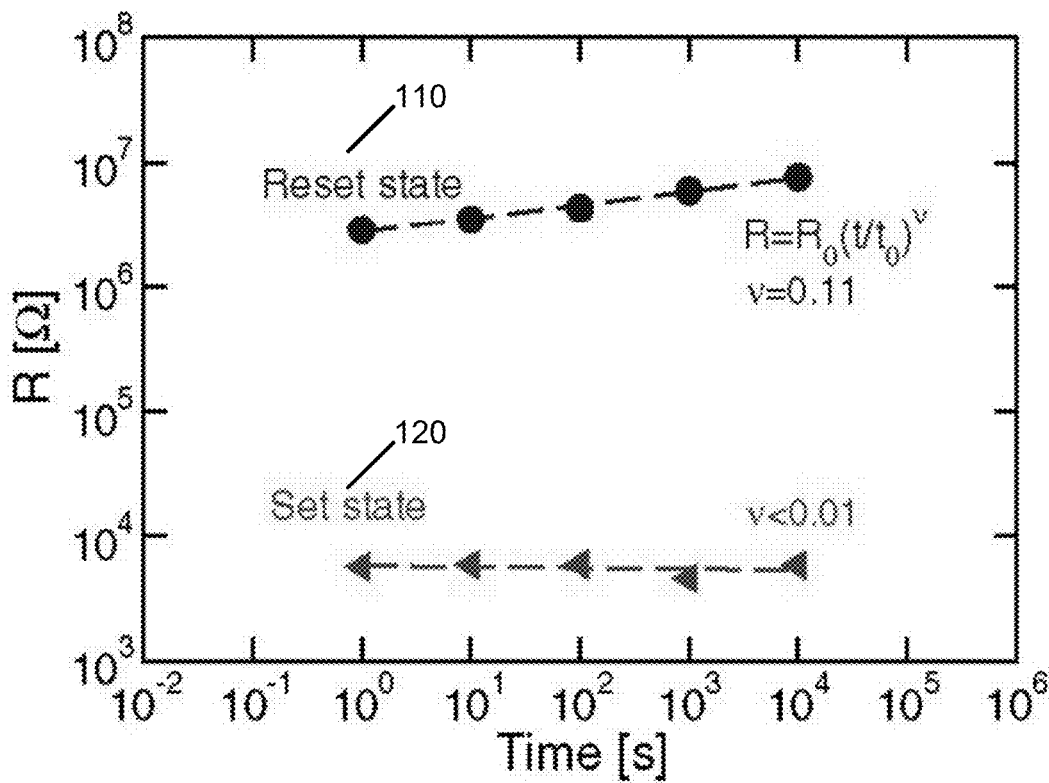
FIG. 1 is a graph of resistance versus time and is used to describe the drift at higher and lower resistance states.

The following abbreviations that may be found in the specification and/or the drawing figures are defined as follows:

I/F interface
I/O input/output
PCM phase change memory
R resistance
V volts

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As stated above, the resistance drift for PCM does not need to be zero, but the drift coefficient needs to be reduced to <0.005 for neuromorphic applications. Conventional techniques such as projected cell have been proposed to reduce PCM resistance drift, but the results cannot meet the target drift coefficient of less than 0.005.

It is possible to use circuits to compensate PCM drift for neuromorphic applications. There are, however, challenges in this regard. For instance, drifting at different speeds: High R (resistance) state drifts faster; meanwhile, Low R states drift slower. Additionally, there are unknown resistor values in the array that makes up the neuromorphic network structure.

FIG. 1 is a graph of resistance (R, in Ohms, $\Omega$) versus time (in seconds) and is used to describe the drift at higher and lower resistance states. The reset state 110 is described by $R=R_0(t/t_0)^v$, where the drift coefficient $v=0.11$. As can be seen, the reset state 110 starts at about $5 \times 10^6$ Ohms at time is $10^0$ seconds, and moves upward until about $1 \times 10^7$ Ohms at time is $10^4$ seconds. For the set state 120, where $v<0.01$, the set state has a low resistance near about 8×10³ Ohms between times of 10⁰ to 10⁴ seconds.

To address issues such as these, exemplary approaches described herein include the following:

1) The drift is always in the direction of resistance increase;

2) Set pulses are sent to every PCM resistor individually once every few minutes in exemplary embodiments; and 3) The set pulse will crystallize the PCM and reduce resistance at a rate that compensates for the drift toward high resistance.

There are a number of exemplary embodiments described below that implement these and other approaches.

Figure 2:
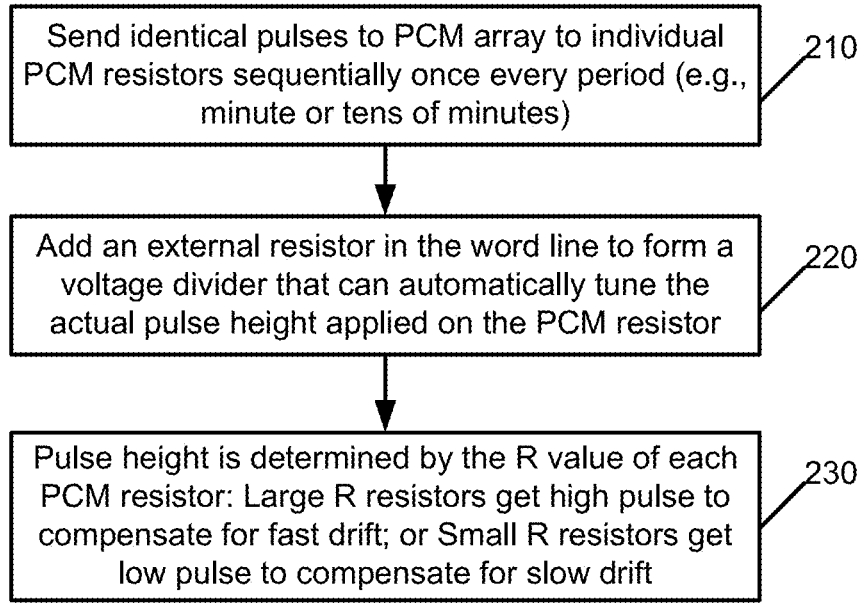
FIG. 2 is an exemplary method for compensating PCM drift for neuromorphic applications.
Figure 3:
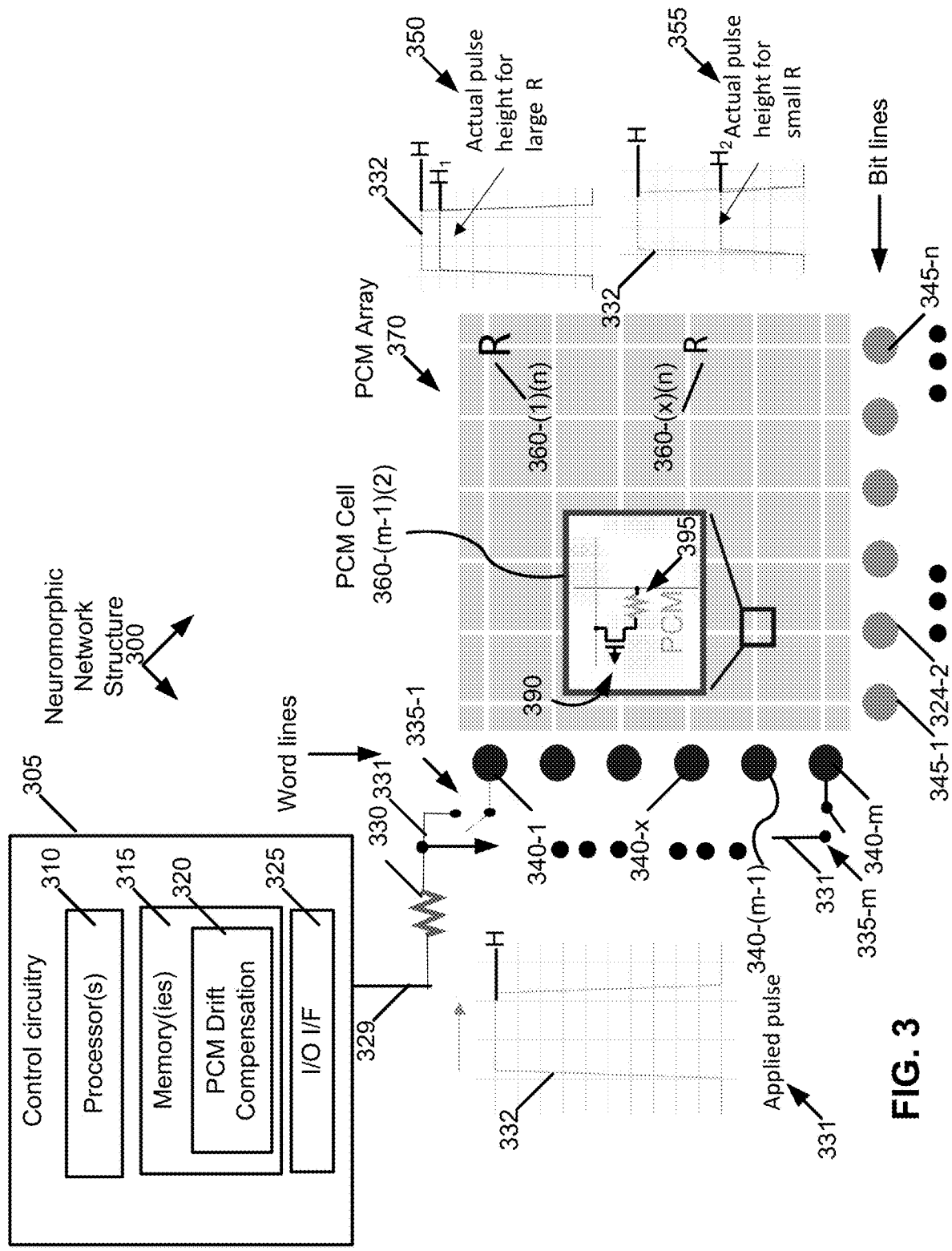
FIG. 3 illustrates exemplary circuitry for a neuromorphic application and pulse heights based on the method of FIG. 2.

A first exemplary embodiment for compensating PCM drift for neuromorphic applications is now described. Referring to FIG. 2, this figure is an exemplary method for compensating PCM drift for neuromorphic applications. Refer also to FIG. 3, which is explained in conjunction with FIG. 2. FIG. 3 illustrates exemplary circuitry for a neuromorphic application and pulse heights based on the method of FIG. 2.

In FIG. 3, a neuromorphic network structure 300 comprises control circuitry 305 and a PCM array 370. The neuromorphic network structure 300 may be, for instance, a memory circuit as part or all of an integrated circuit (commonly referred to as a memory chip). The control circuitry comprises in one example one or more processors 310, one or more memories 315, and an input/output (I/O) interface (I/F) 325. The one or more memories comprise program instructions embodied in an example as a PCM drift compensation program 320. In this example, the PCM drift compensation program 320, while being executed by the one or more processors 310, causes the neuromorphic network structure 300 (e.g., via the control circuitry 305) to perform operations described herein (such as in blocks of FIG. 2). In this embodiment, the PCM drift compensation program 320 may be updatable and comprises computer readable program instructions, where the memory 315 is a computer readable storage medium. Another possibility is that the PCM drift compensation program 320 can be implemented entirely in circuitry 305, such as being implemented as part of an application-specific integrated circuit. Yet another possibility is that some combination of hardware and software may be used. The I/O I/F 325 is used for various functions, such as to apply pulses to the word lines 340 and bit lines 345. The illustrated filled circles may also be considered to be elements use to contact the corresponding word lines 340/bit lines 345.

The PCM array 370 comprises an m (row) by n (columns) matrix of PCM cells 360. The PCM array 370 is in an exemplary embodiment analog phase change memory array. PCM could be either analog (many states) or digital (two states). The drift is more important for analog memory. Digital PCM still has a drift problem, but the memory window is typically large. However, the examples described herein may also be applied there, or to any other technologies using PCM. Each row is a word line 340 and each column is a bit line 345 in this example. There are m word lines 340 and n bit lines 345. A PCM cell 360 is shown at word line 340-($m-1$) and bit line 324-2 and is consequently referenced as PCM cell 360-($m-1$)(2). This PCM cell 360 comprises a selection transistor 390 and a corresponding PCM 395, illustrated using a resistor symbol. Because the PCM 365 operates via resistive memory, this will also be called a PCM resistor 395.

Referring also to FIG. 2, in block 210, identical pulses 331 are sent to the PCM array to individual PCM resistors 395 sequentially once every period such as every minute or tens of minutes. By "sequentially", it is meant that a set pulse 331 is sent to one of the individual PCM resistors 395, then is sent to another of the individual PCM resistors 395, . . . , and this process continues until non-overlapping set pulses 331 have been sent to a certain number of individual PCM resistors 395. This operation is performed by the control circuitry 305, e.g., under control of the PCM drift compensation program 320. To address a PCM resistor 395, a corresponding switch 335 for the corresponding row would be enabled (e.g., "shut") and a corresponding selection transistor 390 would be enabled. This allows each PCM resistor 395 in a row (as a word line 340) to be individually addressed. By "identical" pulses, it is meant that the pulse does not need to be changed from the source. Using an "identical" pulse is a major advantage of the exemplary embodiments. Normally, one would need different pulses to correct the drift for different PCM cells. In this case, the control circuit becomes extremely complicated for a large array. One exemplary benefit of the exemplary embodiments is that one can send the same pulse to all PCM cells and correct all of them. Note that there may be slight differences in the pulses, due to normal variances in creating similar pulses, so the same set pules may be substantially, but not exactly, the same. From the perspective of the circuitry used to create the pulse, it should be assumed that the set pulses are the same, but actual pulse envelopes might differ slightly.

Figure 6:
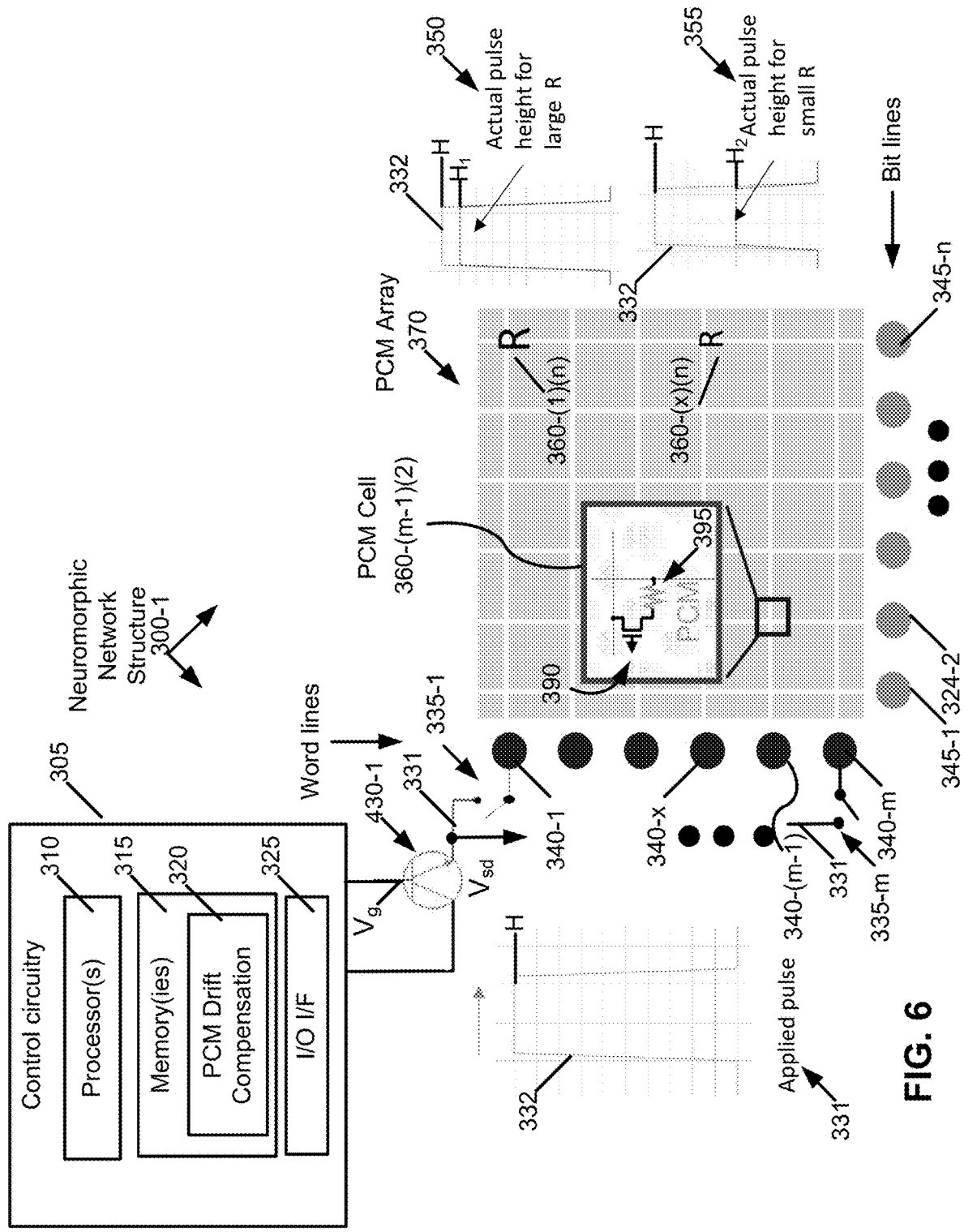
FIG. 6 illustrates exemplary circuitry for a neuromorphic application and pulse heights based on the method of FIG. 2.

As illustrated in block 220, an external resistor 330 is added in the word line 340 to form a voltage divider that can automatically tune the actual pulse height applied on the PCM resistor 395. The external resistor 330 is a device compensating for phase change memory resistance drift in cells in the associated word line. The external resistor 330 is referred to as "external" (in this example) because the resistor is outside the PCM array 370. This example illustrates a single resistor 330 for the PCM array 370. A corresponding switch 335-1 is also shown, which allows the resistor 330 to be connected to or disconnected from the word line 340-1. There are m switches 335, one for each of the m word lines 340. Each switch 335 is connected to a line 331. This one resistor per PCM array is suitable, if there are switches 335 for each word line 340 to connect to this resistor at different times. If this resistor can be made tunable (e.g., using a transistor as illustrated in FIG. 6) this could allow further tuning, e.g., for individual word lines.

Figure 3A:
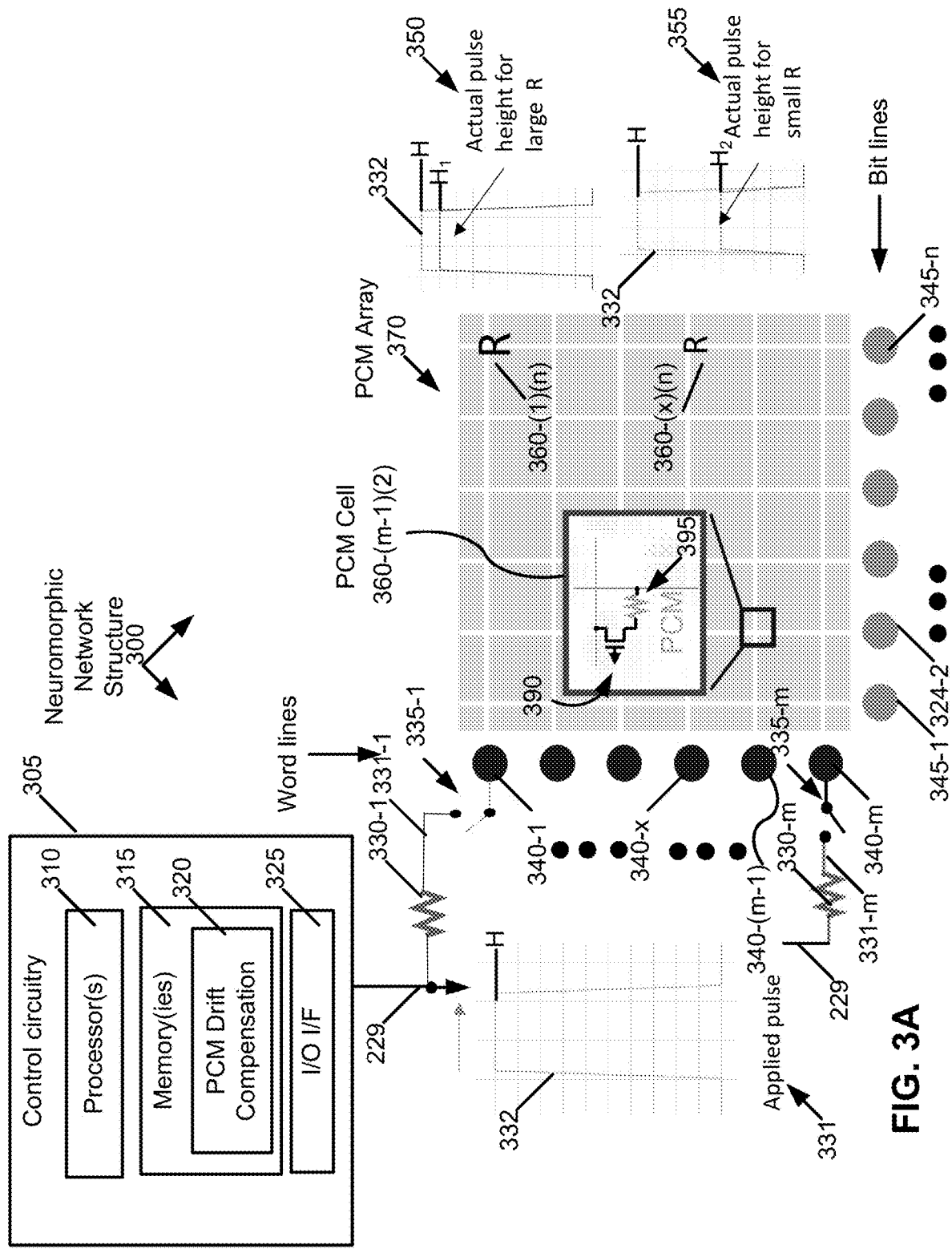
FIG. 3A is another example of exemplary circuitry for a neuromorphic application and pulse heights based on the method of FIG. 2.

Although only one resistor 330-1 and corresponding switch 335 are illustrated in FIG. 3, each of the word lines 340-1 through 340-$m$ could have a corresponding resistor 330 and switch 335. FIG. 3A illustrates this possibility, where there are resistors 330-1 through 330-$m$, one resistor 330 for each of a corresponding word line 340-1 through 340-1 $m$. Each resistor 330 is couples to a line 229 and has a corresponding output line 331-1 through 331-$m$, which is coupled to a corresponding switch 335-1 through 335-$m$. Note that the circuitry illustrated in FIG. 3A is only one possibility, and other circuitry might be used. As an example, the switches 335 may be placed in lines 229 (prior to the resistors 33), or other changes may be made.

As for the period, with the exemplary embodiments herein, one does not need to send in pulses every clock cycle or every second. The frequency of sending the pulse depends on the drift coefficient of the PCM and other parameters and may be tuned accordingly. Every few minutes (say, 3-5 minutes) is one example. Tens of minutes (say, 10 or 15 or 20 minutes) might also be used. It is also possible one hour (or even longer) can be used. One skilled in this area should easily be able to determine a suitable period.

As illustrated by block 230, pulse height is determined by the R value of each PCM resistor 395 in a PCM cell 360: Large R get high pulse to compensate for fast drift; or Small R get low pulse to compensate for slow drift. There is no need to read out the resistor values. That is, the voltage is divided between the PCM resistor 395 and the external resistor 330. Even though a PCM resistor value is not read out, different voltage can be applied to the PCM resistor 395 using the external resistor 330 as a voltage divider.

In the example of FIG. 3 (or FIG. 3A), there is a cell 360-(1)(n) having a large R value. The applied pulse 331, e.g., applied by the I/O I/F 325 to the corresponding word line 340-1 under control of the PCM drift compensation program 320, is illustrated having an envelope 332 (e.g., rise time+duration+fall time) with a height H. This gets translated via a voltage divider (described below) to be an actual pulse height of $H_1$, which is close to the height H. This is an example for the large R case. There is always large R and small R in the array. The instant exemplary techniques apply to all of them automatically to any corresponding resistor values. There is also a cell 360-(x)(n) having a small R value and the applied pulse 331 gets translated via a voltage divider to be an actual pulse height of $H_2$, which is about half the height H.

Concerning the shape (as illustrated by the envelope 332) of the pulse 331, the pulse shape is another parameter that could be modified, such as through optimization. The rise could be sharp. The falling edge should be long enough the cause crystallization. This is a function of the PCM cell 360 being used, and one skilled in this area can determine parameters for the envelope 332 based on the PCM cell 360 being used.

Figure 4:
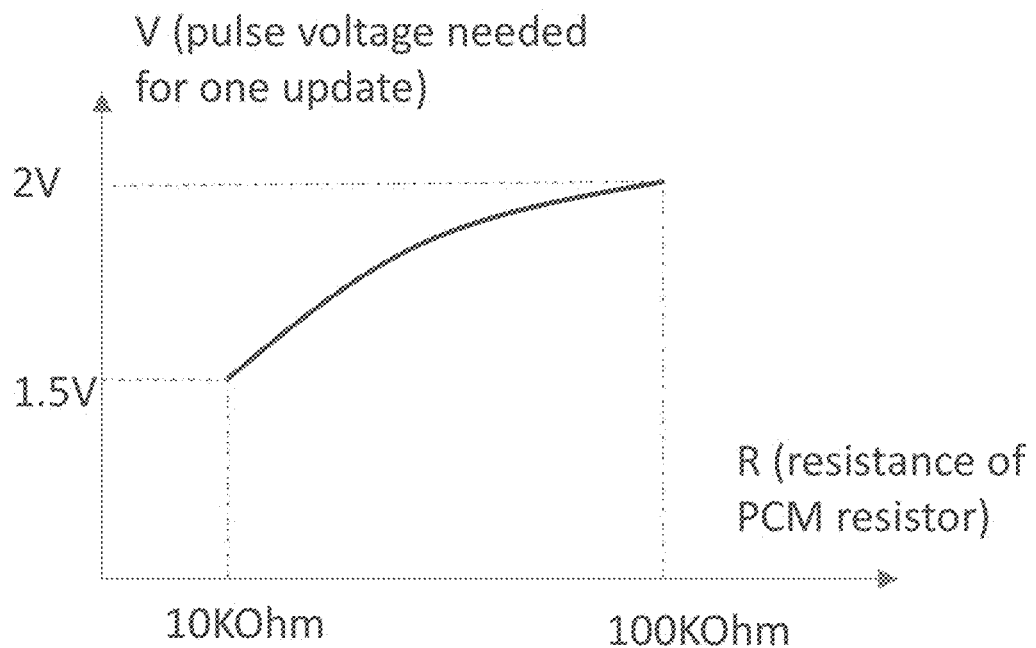
FIG. 4 is a graph illustrating a required pulse voltage versus a PCM resistor R in an exemplary embodiment.

Turning to FIG. 4, this figure is a graph illustrating a required pulse voltage versus a PCM resistor R in an exemplary embodiment. This graph illustrates the voltage V for a pulse voltage (e.g., used to create the applied pulse 331) for one update based on R, the resistance of the PCM resistor 395 in a PCM cell 360. Typical resistance of PCM resistors typically varies from about (~) 10 KOhm to ~100 KOhm, although these are not limiting. As for pulse widths, typical gradual SET programming uses 5 to 10 ns (nanoseconds). It is noted that this graph is used to illustrate a general case. The voltage is calculated based on the resistance values. In reality, the pulse height and duration should be tailored to the PCM device (e.g., PCM resistor 395). It should be noted that the values of 10 KOhm to 110 KOhm are merely exemplary and will depend on the actual PCM cell.

Figure 5:
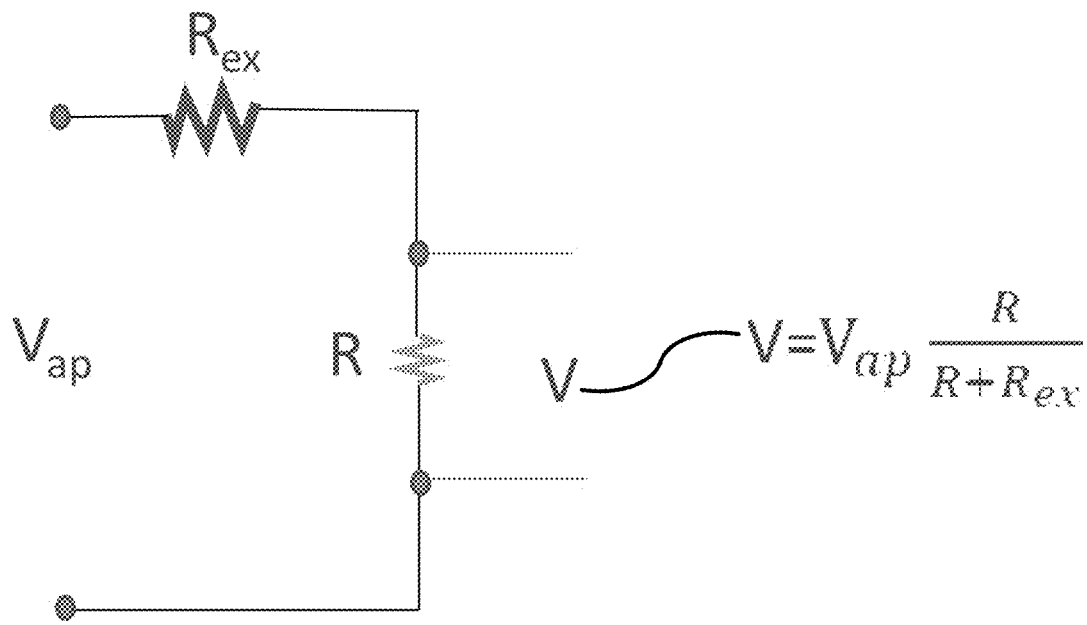
FIG. 5 is a voltage divider circuit used for generating required input voltage for different PCM resistors.

Referring to FIG. 5, this figure is a voltage divider circuit used for generating required input voltage for different PCM resistors. The $R_{ex}$ is an external resistor and corresponds to a resistor 330. Using two variables ($V_{ap}$ and $R_{ex}$), the required input voltage for different PCM resistors can be determined. The voltage divider equation is as follows:

$$V = V_{ap} \frac{R}{R + R_{ex}},$$

where R is the PCM resistor 395, Re is the external resistor 330, $V_{ap}$ is voltage (e.g., the height H) of the applied pulse 331, and V is the voltage (e.g., the $H_1$ or $H_2$) of the pulse as it reaches the corresponding R.

One example of using this is as follows. Solve for external resistor $R_{ex}$ and applied pulse voltage $V_{ap}$, and one may determine $R_{ex}$=3.8 KOhm, $V_{ap}$=2.1 V for this exemplary case. It is noted that FIG. 4 provides two endpoints: (10 KOhm, 1.5V) and (100 KOhm, 2V). Each of these can be used in the equation above to provide one partially completed equation. This will yield two partially filled equations with two unknowns ($R_{ex}$ and $V_{ap}$), and therefore allows solving for the two unknowns.

It is noted that all the design of $R_{ex}$ and $V_{ap}$ can be performed before the chip (comprising e.g., the neuromorphic network structure 300) is made. This is because the PCM resistance values are determined by the technology and have a certain range. For training the PCM drift compensation application 320, a certain resistance range would also be used for this. If the PCM resistance is out of the range, this will be programmed into a value inside this usable range. For an inference-only implementation, all the PCM resistor values are fixed (one should program the PCM resistor to the desired values beforehand). So, it is possible to know the resistance values ahead of time. It may also be possible to have an actual-value implementation, where PCM resistances are measured (e.g., in lieu of or in addition to the inferencing of the PCM resistances). For instance, using a variable resistor (such as the transistor describe in reference to FIG. 6) for the PCM array would allow the actual-value implementation to occur.

FIG. 6 is an illustration of another example for compensating PCM drift for neuromorphic applications. This example has a neuromorphic network structure 300-1 that uses a transistor 430 to replace the single input resistor 330 of FIG. 3. The transistor 430 is a device compensating for phase change memory resistance drift in cells in the associated word line, e.g., and operates as the resistor as in block 220 of FIG. 2. The resistance of the transistor 430 (such as 430-1) can be tuned by gate voltage, $V_g$, which is supplied (along with the source/drain voltage, $V_{sd}$) by the control circuitry 305, e.g., under control of the PCM drift compensation program 320. This transistor 430 can be used as a nonlinear resistor and can be applied on, e.g., a word line basis. That is, the resistance of the transistor 430 can be varied, as per block 230 of FIG. 2, on a word line basis.

It is noted that it is possible to have a single transistor per word line, similar to what is shown in FIG. 3A for resistors 330. It is also possible to use both transistors and resistors in an application. Furthermore, although the word line(s) 340 has been used to couple the resistor(s) 330 to the PCM cells 360, it is also possible to use the bit line(s) 345 instead of the word line(s) 340 to couple the resistor(s) 330 to the PCM cells 360.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus, comprising:
   an analog phase change memory array, the phase change memory array comprising an array of cells addressable and accessible through first lines and second lines; and
   at least one device coupled to one or more of the first lines, the at least one device able to be coupled to or decoupled from the one or more first lines to compensate for phase change memory resistance drift in resistance of at least one of the cells in the one or more first lines, the at least one device being resistive and compensating for resistance drift based at least on a voltage divider between the at least one device and corresponding at least one of the cells when the at least one device is coupled to the corresponding at least one of the cells.

2. The apparatus of claim 1, wherein one or more of the at least one devices comprise a resistor.

3. The apparatus of claim 2, wherein the apparatus comprises one or more switches, and wherein the at least one device comprises a single resistor for all of the one of the one or more switches, wherein the single resistor is coupled to or uncoupled from each of the one or more first lines via a corresponding one of the one or more switches.

4. The apparatus of claim 2, wherein the at least one device comprises a resistor for each corresponding one of the one or more first lines.

5. The apparatus of claim 2, wherein a value of one of the resistors is about 3.8 KOhm.

6. The apparatus of claim 1, wherein the apparatus comprises one or more switches, and wherein the at least one device comprises a single transistor for all of the one or more switches, wherein the single transistor is coupled to or uncoupled from each of the one or more first lines via a corresponding one of the one or more switches.

7. An apparatus, comprising:
an analog phase change memory array, the phase change memory array comprising an array of cells addressable and accessible through first lines and second lines;
one or more switches;
at least one device coupled to one or more of the first lines, the at least one device able to be coupled to or decoupled from the one or more first lines to compensate for phase change memory resistance drift in resistance of at least one of the cells in the one or more first lines, wherein the at least one device comprises a single transistor for all of the one or more switches, wherein the single transistor is coupled to or uncoupled from each of the one or more first lines via a corresponding one of the one or more switches;
control circuitry, wherein the control circuitry is configured to use the transistor as a tunable resistor at least by adjusting gate voltage of the transistor to adjust a resistance of the transistor.

8. The apparatus of claim 1, wherein the cells able to be connected to a device have a phase change memory resistance having a value that can be set to more than two states.

9. The apparatus of claim 8, wherein the phase change memory resistance values can vary from about 10 KOhm to about 100 KOhm.

10. The apparatus of claim 8, further comprising control circuitry and wherein the control circuitry is configured to reduce phase change memory resistance drift of the phase change resistance by sending a same set pulse to individual phase change memory resistors sequentially once each period.

11. The apparatus of claim 10, wherein the period is every few minutes.

12. The apparatus of claim 10, wherein the period is every tens of minutes.

13. The apparatus of claim 10, wherein the set pulse satisfies following conditions:
the set pulse is a voltage pulse that crystalizes the phase change memory resistor and reduces the resistance to compensate the resistance drift toward a high resistance value; and
the set pulse voltage is automatically divided between the at least one device and phase change memory resistor so that an actual pulse voltage applied to the phase change memory resistor is tailored to the resistance value of that phase change memory resistor.

14. The apparatus of claim 13, wherein a pulse height of the voltage pulse is about 2.1 Volts.

15. The apparatus of claim 1, wherein one of the following is true: the first lines are word lines and the second lines are bit lines; or the first lines are bit lines and the second lines are word lines.

16. An apparatus, comprising:
an analog phase change memory array, the phase change memory array comprising an array of cells addressable and accessible through first lines and second lines; and
at least one device coupled to one or more of the first lines, the at least one device able to be coupled to or decoupled from the one or more first lines to compensate for phase change memory resistance drift in resistance of at least one of the cells in the one or more first lines, the at least one device being resistive and compensating for resistance drift based at least on a voltage divider between the at least one device and corresponding at least one of the cells when the at least one device is coupled to the corresponding at least one of the cells; and
control circuitry configured to send, using the first lines and second lines, a same set pulse through the at least one device to a plurality of individual phase change memory resistors in the phase change memory array sequentially once every period.

17. The apparatus of claim 16, wherein the period is every few minutes.

18. The apparatus of claim 16, wherein the period is every tens of minutes.

19. The apparatus of claim 16, wherein the set pulse satisfies following conditions:
the set pulse is a voltage pulse that crystalizes the phase change memory resistor and reduces the resistance to compensate the resistance drift toward a high resistance value; and
the set pulse voltage is automatically divided between the at least one device and phase change memory resistor so that an actual pulse voltage applied to the phase change memory resistor is tailored to the resistance value of that phase change memory resistor.

20. The apparatus of claim 16, wherein the control circuitry comprises one or more processors and one or more memories comprising computer readable code, wherein the one or more processors, in response to loading and executing the computer readable code, cause the sending of the same pulse.

* * * * *